United States Patent
Kim et al.

(10) Patent No.: US 12,044,813 B2
(45) Date of Patent: Jul. 23, 2024

(54) CHARGE SENSITIVE AMPLIFIER AND RADIATION SENSOR INCLUDING THE SAME

(71) Applicants: CHANGWON NATIONAL UNIVERSITY Industry Academy Cooperation Corps, Changwon-si (KR); Electronics and Telecommunications Research Institute, Daejeon (KR)

(72) Inventors: Young Hee Kim, Changwon-si (KR); Hong Zhou Jin, Changwon-si (KR); Kyung Hwan Park, Daejeon (KR)

(73) Assignees: CHANGWON NATIONAL UNIVERSITY INDUSTRY ACADEMY COOPERATION CORPS, Changwon-si (KR); ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 419 days.

(21) Appl. No.: 17/362,267

(22) Filed: Jun. 29, 2021

(65) Prior Publication Data

US 2021/0405224 A1    Dec. 30, 2021

(30) Foreign Application Priority Data

Jun. 30, 2020    (KR) .......................... 10-2020-0080408

(51) Int. Cl.
*G01T 1/24* (2006.01)
*H03F 3/70* (2006.01)

(52) U.S. Cl.
CPC .............. *G01T 1/247* (2013.01); *H03F 3/70* (2013.01)

(58) Field of Classification Search
CPC ....... G01T 1/247; G01T 1/17; G01T 1/20184; G01T 1/208; H03F 3/70; H03F 2203/45526; H03F 3/45475
See application file for complete search history.

(56) References Cited

U.S. PATENT DOCUMENTS

2002/0153957 A1\* 10/2002 Jordanov ................ H03F 3/087
                                                            330/308
2005/0024150 A1\*  2/2005 Gordon .................... H03F 3/195
                                                            330/307

(Continued)

FOREIGN PATENT DOCUMENTS

KR           2007101991 A  * 10/2007 ............... H04N 5/32

*Primary Examiner* — Christine S. Kim
(74) *Attorney, Agent, or Firm* — KILE PARK REED & HOUTTEMAN PLLC

(57) ABSTRACT

Disclosed are a charge sensitive amplifier capable of minimizing a variation in a signal voltage of an output signal by applying a bias direct current to a gate of a feedback transistor, and a radiation sensor including the same. According to the charge sensitive amplifier and the radiation sensor including the same, it is possible to minimize a variation in a signal voltage of a charge sensitive amplifier output signal by applying a current, which is formed by mirroring a current bias circuit designed to be insensitive to PVT variations, to a gate of a feedback transistor. Furthermore, it is possible to reduce a variation in charging time and enable high-speed sensing by charging the signal voltage to the level of a common voltage VCOM by using a constant current supplied through a bandgap reference (BGR) circuit.

16 Claims, 8 Drawing Sheets

(56) References Cited

U.S. PATENT DOCUMENTS

| | | | |
|---|---|---|---|
| 2006/0255281 A1* | 11/2006 | Lal | G04F 5/16 |
| | | | 250/370.11 |
| 2016/0259063 A1* | 9/2016 | Lee | G01T 1/023 |
| 2019/0290231 A1 | 9/2019 | Hekmatshoartabari | |
| 2020/0116487 A1* | 4/2020 | Ward | G01C 19/5726 |

* cited by examiner

CHARGE SENSITIVE AMPLIFIER AND RADIATION SENSOR INCLUDING THE SAME

BACKGROUND

1. Technical Field

The present disclosure relates to a charge sensitive amplifier and a radiation sensor including the same, and more particularly, to a charge sensitive amplifier capable of minimizing a variation in a signal voltage of an output signal by applying a bias direct current to a gate of a feedback transistor, and a radiation sensor including the same.

2. Related Art

Random numbers are being used in various science and technology fields such as encryption and simulation. Most of them use pseudo random numbers, but in the field of Internet of Things (IoT) security requiring a high security level and high reliability, the most effective true random numbers are used to prevent hacking which is getting more advanced day by day.

Meanwhile, a random number generator using a quantum mechanical physical phenomenon may generate the most ideal random number among hardware-based random number generators. Since the natural decay phenomenon of radioactive isotopes such as beta rays, gamma rays, or X-rays has all characteristics that can be used as entropy for true random numbers such as randomness of a decay event, non-correlation with a previous event, and irrelevance in physical environment conditions, it may generate ideal random numbers, and research for isotope-based random number generators has been continued.

Particularly, in the case of using beta decay of beta rays among radiation, there are advantages of easy shielding, a small size, high portability, a high generation rate, and low semiconductor damage. A Ni-63 beta radiation source may detect charge, which is generated by a PIN diode, through a module circuit using a charge sensitive amplifier (CSA). Meanwhile, in the case of X-rays, research for an ASIC chip including a charge sensitive amplifier has been conducted separately.

FIG. 1 is a circuit diagram of a beta ray detection sensor 100 in accordance with the related art.

As illustrated in FIG. 1, the beta ray detection sensor 100 in accordance with the related art includes a charge sensitive amplifier 110, a voltage follower 120, a differentiator 130, an integrator 140, and a comparator 150.

In general, in the charge sensitive amplifier, a feedback capacitor $C_f$ and a feedback resistor $R_f$ are connected in parallel between a negative input terminal of a CMOS operational amplifier OPAMP and an output node CSA_OUT of the charge sensitive amplifier.

The charge sensitive amplifier integrates an input charge pulse generated by a PIN diode, converts the integrated input charge pulse into an output voltage $\Delta Vs$, which is a signal voltage, and lowers the level of the output voltage $\Delta Vs$ to the level of a common voltage VCOM. Then, the pulse of the output voltage is charged with a time constant $\tau$ ($=R_f*C_f$) to the common voltage VCOM, which is connected to a positive input terminal of the operational amplifier, by the resistor. In the case of using the feedback resistor, there are disadvantages in that, due to parasitic resistance existing in a CMOS process, the signal voltage is small, and a layout area occupied by the feedback resistor is large. Thus, it is general to implement the feedback resistor by using a PMOS transistor.

In the charge sensitive amplifier using the PMOS transistor, a ground GND or DC voltage may be applied to a gate of the PMOS transistor. In such a case, a driving current of the PMOS feedback transistor changes according to MOS model parameters, temperature, and a power supply voltage VDD. Thus, feedback resistance sensitively changes according to process, voltage, and temperature (PVT) variations.

FIG. 2 is a circuit diagram of an analog front-end circuit 200 for testing the operation of a charge sensitive amplifier 210 of the beta ray detection sensor in accordance with the related art, FIG. 3 is a circuit diagram of the charge sensitive amplifier 110 of the beta ray detection sensor in accordance with the related art, and FIG. 4 is a circuit diagram of a circuit for generating a bias DC voltage applied to the charge sensitive amplifier 110 of the beta ray detection sensor in accordance with the related art.

Referring to FIG. 2, the analog front-end circuit 200 includes a PIN diode, a test capacitor $C_{TEST}$, and the charge sensitive amplifier 210.

The PIN diode has an anode connected to a negative input terminal of an operational amplifier (OPAMP) used in the charge sensitive amplifier and a cathode connected to a VHH (=5 V) voltage source. Between an electron-hole pair (EHP) generated by NI-63 beta rays having high energy, electrons move to the VHH voltage and holes move to the negative input terminal of the operational amplifier 111. At this time, the charge sensitive amplifier 110 integrates charge and outputs a charge sensitive amplifier output signal CSA_OUT, and the charge sensitive amplifier output signal CSA_OUT outputs the signal voltage $\Delta Vs$.

When $\tau=R_f*C_f$, which is the time constant of the feedback resistor $R_f$ and the feedback capacitor $C_f$ connected between an input voltage VIN serving as the negative input terminal of the operational amplifier 111 of the charge sensitive amplifier 110 of FIG. 3, and the charge sensitive amplifier output signal CSA_OUT serving as an output terminal, is much larger than a pulse width of charge injected from the PIN diode, the signal voltage $\Delta Vs$ outputs a maximum voltage $-Q_s/C_f$.

$Q_s$ denotes signal charge that contributes to a current through the input terminal of the operational amplifier 111 after the electron-hole pair (EHP) is generated in the PIN diode by beta ray particles. If there is no feedback resistor $R_f$, the charge sensitive amplifier 110 operates like an integrator and maintains the signal voltage $\Delta Vs$ as is. However, since the charge sensitive amplifier 110 includes the feedback resistor $R_f$ connected in parallel to the feedback capacitor $C_f$, the charge sensitive amplifier output signal CSA_OUT, which is the output signal of the charge sensitive amplifier 110, is charged to the level of the common voltage VCOM, which is the voltage of the positive input terminal of the operational amplifier 111, with the time constant $\tau$.

The smaller the feedback resistor $R_f$, the faster the discharge time, which makes high-speed sensing possible. On the other hand, since discharge is accelerated by the feedback resistor $R_f$ while signal charge is integrated, the signal voltage $\Delta Vs$ is lowered. Meanwhile, when polysilicon, which is a linear resistor, is used as the feedback resistor $R_f$, there are disadvantages in that, due to parasitic resistance existing between the polysilicon, which is a resistive layer, and a p-substrate in the CMOS process, the signal voltage $\Delta Vs$ is small, and a layout area occupied by the feedback resistor is large. Thus, the feedback resistor may be implemented using a PMOS transistor. In FIG. 2, the test capacitor $C_{TEST}$ is a circuit element for testing the operation of the charge sensitive amplifier by applying a signal pulse to the test capacitor $C_{TEST}$.

A bias DC voltage VBIASP_CSA is applied to a gate node of a PMOS feedback transistor MP1 of the charge sensitive amplifier 110. The bias DC voltage VBIASP_CSA is formed by converting a reference current IREF_2p5 μA, which is a constant current of 2.5 μA generated by a bandgap reference circuit, into a bias reference voltage VREF_VBIASP of 1.522 V through a current-voltage converter 112 illustrated in FIG. 4.

At this time, since the bias reference voltage VREF_VBIASP has a low current driving ability, a bias DC voltage VBIASP_CSA=VREF_VBIASP is generated by a voltage follower 113 using the operational amplifier OPAMP as illustrated in FIG. 4.

In a case where the bias DC voltage VBIASP_CSA of FIG. 4 is connected to the gate node of the PMOS feedback transistor MP1 of FIG. 3, when signal charge is injected to the input terminal of the charge sensitive amplifier 110 by beta rays, the source-drain current variation of the PMOS feedback transistor MP1 is large according to PVT (process-voltage-temperature) variations which are the CMOS process, the power supply voltage VDD, and the temperature. Therefore, there are problems in that the signal voltage ΔVs of the charge sensitive amplifier 110 varies greatly according to the PVT variations and after charge integration, and it takes a lot of time to discharge the integrated charge to the common voltage VCOM, which makes high-speed sensing impossible.

TABLE 1

| VDD | TEMP | SS Model | SF Model | TT Model | FS Model | FF Model |
|---|---|---|---|---|---|---|
| 4.5 V | −40° C. | 278 mV | 224 mV | 249 mV | 320 mV | 199 mV |
| | 25° C. | 229 mV | 165 mV | 183 mV | 262 mV | 146 mV |
| | 85° C. | 169 mV | 134 mV | 142 mV | 188 mV | 119 mV |
| 5 V | −40° C. | 280 mV | 219 mV | 243 mV | 320 mV | 192 mV |
| | 25° C. | 220 mV | 157 mV | 176 mV | 253 mV | 139 mV |
| | 85° C. | 125 mV | 113 mV | 117 mV | 150 mV | 106 mV |
| 5.5 V | −40° C. | 237 mV | 166 mV | 189 mV | 276 mV | 157 mV |
| | 25° C. | 126 mV | 109 mV | 118 mV | 160 mV | 105 mV |
| | 85° C. | 66 mV | 70 mV | 73 mV | 82 mV | 74 mV |

Table 1 above shows the simulation result for the signal voltage for the PVT variations of the charge sensitive amplifier 110 that applies the bias DC voltage VBIASP_CSA of FIG. 3. As shown in Table 1 above, the forms of the model parameters of the MOS transistor include a Slow NMOS Slow PMOS (SS) model, a Slow NMOS Fast PMOS (SF) model, a Typical NMOS Typical PMOS (TT) model, a Fast NMOS Slow PMOS (FS) model, a Fast NMOS Fast PMOS (FF) model, and the like.

TABLE 2

| VDD | TEMP | SS Model | SF Model | TT Model | FS Model | FF Model |
|---|---|---|---|---|---|---|
| 4.5 V | −40° C. | 2.29 μs | 0.610 μs | 0.733 μs | 1.553 μs | 0.345 μs |
| | 25° C. | 1.157 μs | 0.424 μs | 0.481 μs | 0.845 μs | 0.267 μs |
| | 85° C. | 0.676 μs | 0.350 μs | 0.362 μs | 0.503 μs | 0.219 μs |
| 5 V | −40° C. | 2.153 μs | 0.547 μs | 0.655 μs | 1.417 μs | 0.317 μs |
| | 25° C. | 0.964 μs | 0.391 μs | 0.430 μs | 0.729 μs | 0.245 μs |
| | 85° C. | 0.361 μs | 0.228 μs | 0.248 μs | 0.338 μs | 0.169 μs |
| 5.5 V | −40° C. | 1.028 μs | 0.365 μs | 0.417 μs | 0.816 μs | 0.255 μs |
| | 25° C. | 0.323 μs | 0.207 μs | 0.237 μs | 0.335 μs | 0.161 μs |
| | 85° C. | Fail | Fail | Fail | Fail | Fail |

Table 2 above shows the simulation result for the pulse width of the comparator output for the PVT variations of the beta ray detection sensor 100 using the charge sensitive amplifier 110 that applies the bias DC voltage VBIASP_CSA of FIG. 3. As shown in Table 1 and Table 2 above which are the simulation results for each corner, in the beta ray detection sensor 100 designed in a 0.18 μm CMOS process using the charge sensitive amplifier 110 that applies the bias DC voltage VBIASP_CSA of FIG. 3, a minimum signal voltage and a maximum signal voltage of the charge sensitive amplifier output signal CSA_OUT are 66 mV and 320 mV, respectively, and minimum and maximum widths of a pulse generated by comparing the output signal having passed through the differentiator 130 and the integrator 140 serving as a pulse shaper with a threshold voltage VTHR_PS of the comparator 150 are Fail and 2.29 μs, respectively. Thus, in some simulation conditions, it can be seen that there is a large variation in the width due to a sensing fail. At this time, the magnitude of the signal voltage of the charge sensitive amplifier output signal CSA_OUT means a voltage that is lowered by the signal voltage ΔVs from the level of the common voltage VCOM by integrating the input charge pulse generated by the PIN diode in the charge sensitive amplifier 110.

SUMMARY

The technical problem to be solved by the present disclosure is to provide a charge sensitive amplifier capable of minimizing a variation in a signal voltage of an output signal by applying a bias direct current, which is formed by mirroring a current bias circuit designed to be insensitive to PVT variations, to a gate of a feedback transistor, instead of biasing the gate of the feedback transistor with a DC voltage, and a radiation sensor including the same.

In order to solve the above problem, a charge sensitive amplifier in accordance with the present disclosure may include: an operational amplifier having a first input terminal to which an input voltage VIN is connected, a second input terminal to which a common voltage VCOM is connected, and an output terminal through which a charge sensitive amplifier output signal CSA_OUT is outputted; a feedback capacitor connected between the first input terminal and the output terminal; and a feedback MOS transistor connected in parallel to the feedback capacitor between the first input terminal and the output terminal.

According to a charge sensitive amplifier and a radiation sensor including the same in accordance with the present disclosure, it is possible to minimize a variation in a signal voltage of a charge sensitive amplifier output signal by applying a current, which is formed by mirroring a current bias circuit designed to be insensitive to PVT variations, to a gate of a feedback transistor, instead of biasing the gate of the feedback transistor with a DC voltage. Furthermore, it is possible to reduce a variation in charging time and enable high-speed sensing by charging the signal voltage to the level of a common voltage VCOM by using a constant current supplied through a bandgap reference (BGR) circuit.

DETAILED DESCRIPTION

Hereinafter, a preferred embodiment of the present disclosure will be described in detail with reference to the accompanying drawings.

Figure 1:
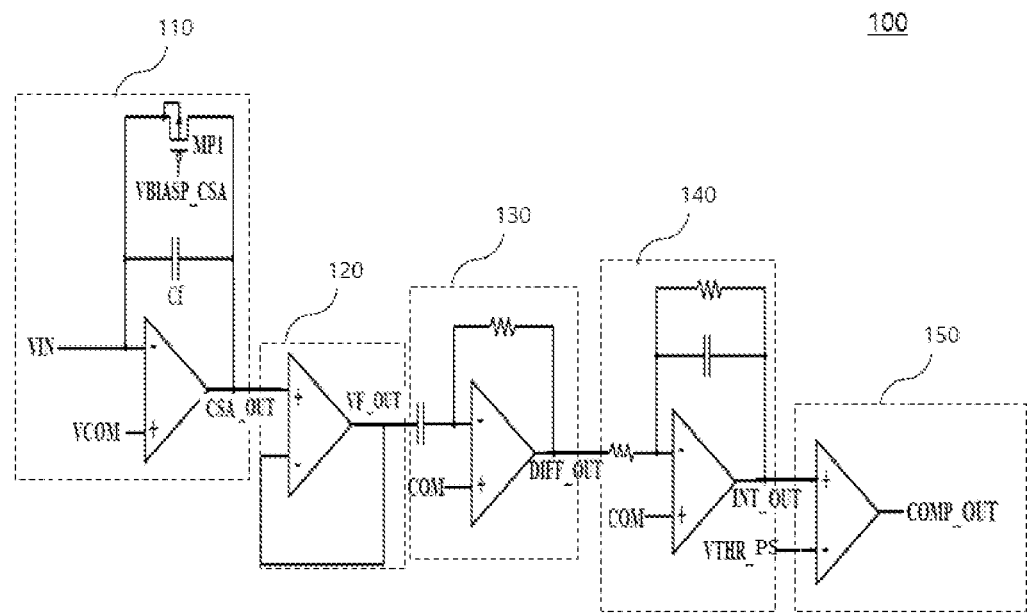
FIG. 1 is a circuit diagram of a beta ray detection sensor in accordance with the related art.
Figure 2:
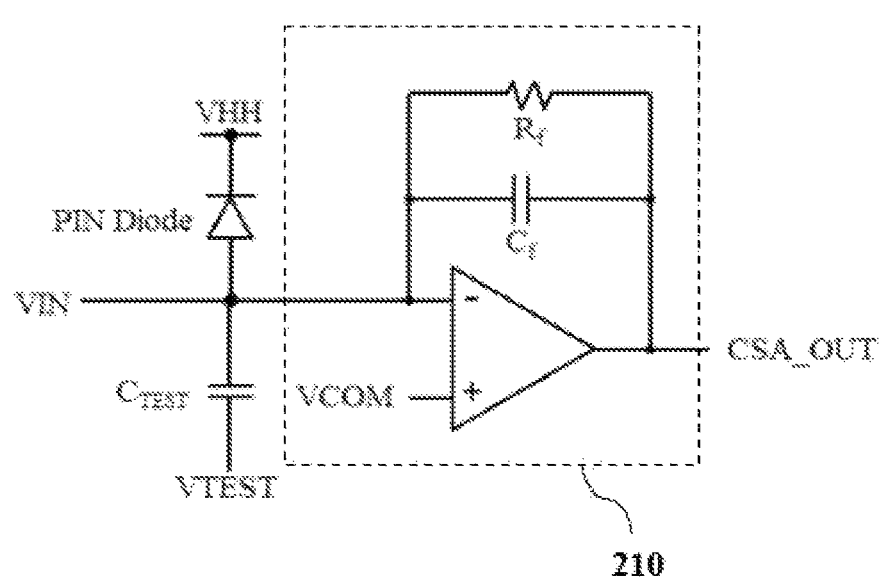
FIG. 2 is a circuit diagram of a circuit for testing an operation of a CSA circuit of the beta ray detection sensor in accordance with the related art.
Figure 3:
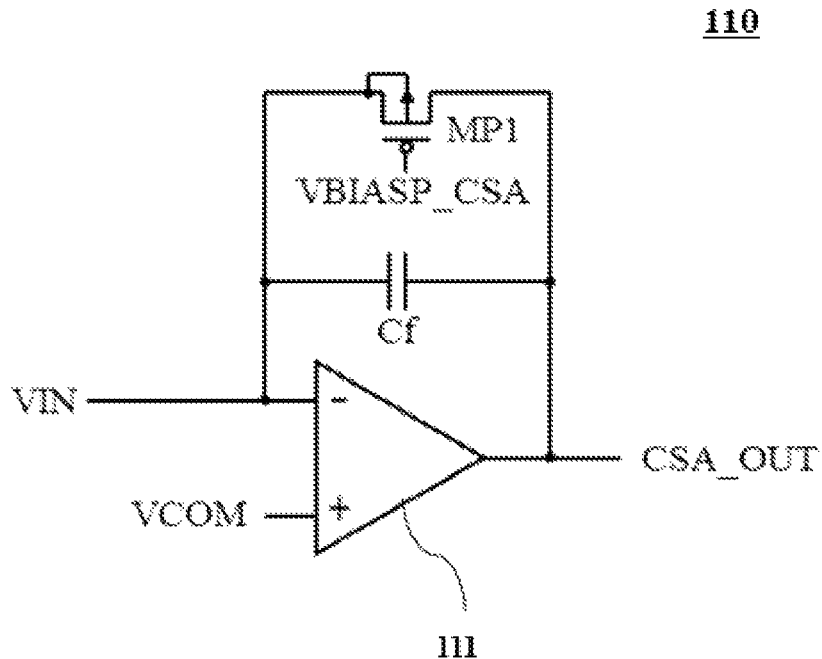
FIG. 3 is a circuit diagram of the CSA circuit of the beta ray detection sensor in accordance with the related art.
Figure 4:
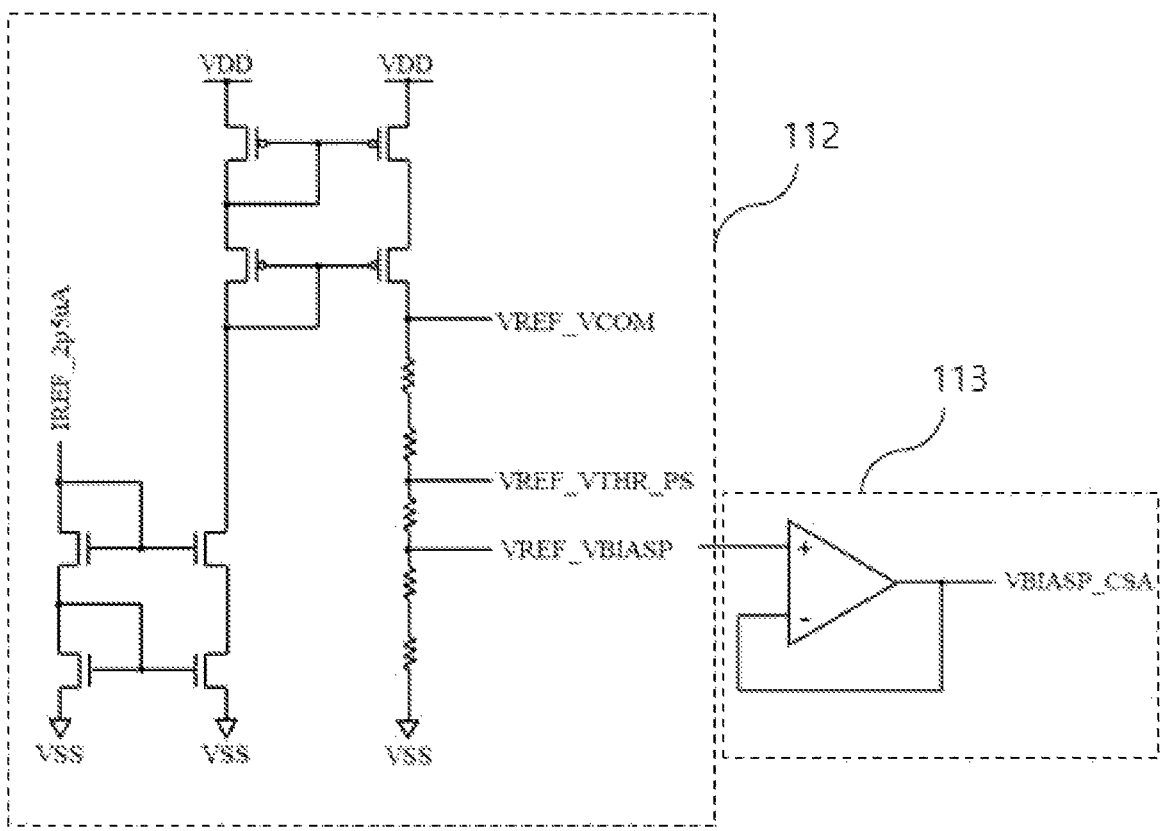
FIG. 4 is a circuit diagram of a circuit for generating a bias DC voltage applied to the CSA circuit of the beta ray detection sensor in accordance with the related art.
Figure 5:
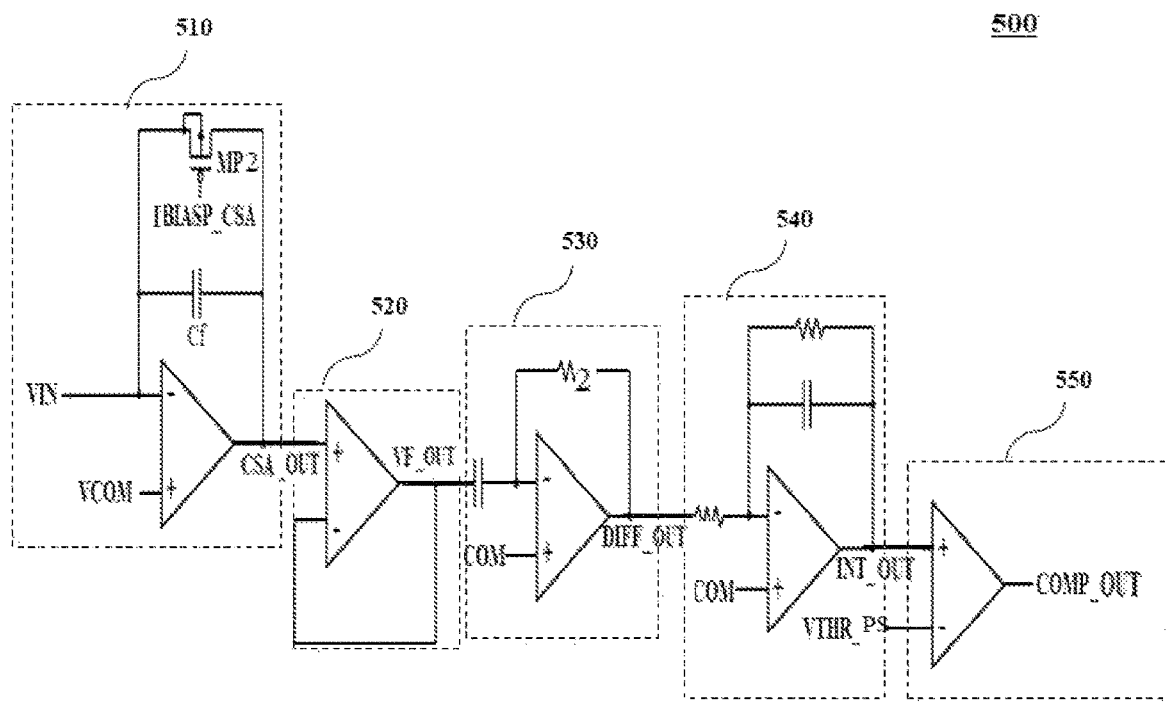
FIG. 5 is a circuit diagram of a radiation sensor including a charge sensitive amplifier in accordance with the present disclosure.
Figure 6:
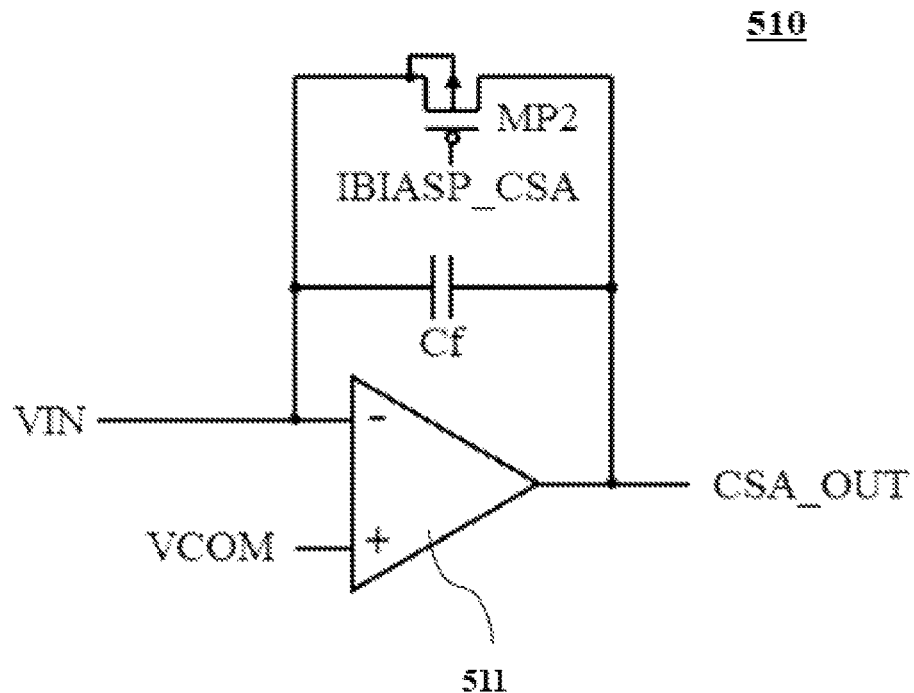
FIG. 6 is a circuit diagram of the charge sensitive amplifier in accordance with the present disclosure.
Figure 7:
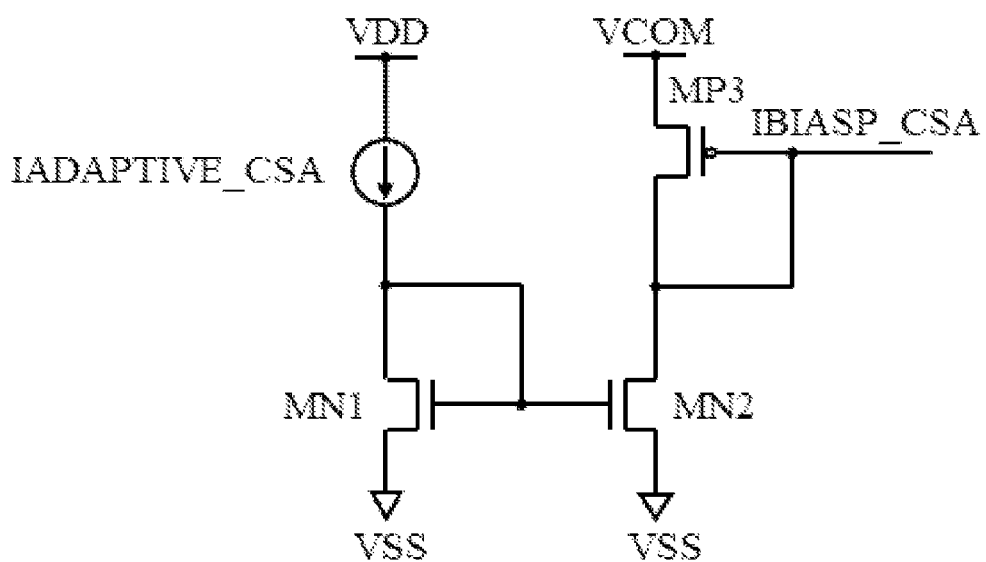
FIG. 7 is a circuit diagram of a circuit for generating a bias direct current applied to the charge sensitive amplifier in accordance with the present disclosure.

FIG. 5 is a circuit diagram of a radiation sensor 500 including a charge sensitive amplifier 510 in accordance with the present disclosure, FIG. 6 is a circuit diagram of the charge sensitive amplifier 510 in accordance with the present disclosure, and FIG. 7 is a circuit diagram of a circuit for generating a bias direct current applied to the charge sensitive amplifier 510 in accordance with the present disclosure.

Referring to FIG. 5 to FIG. 7, the radiation sensor 500 including a charge sensitive amplifier in accordance with the present disclosure includes the charge sensitive amplifier 510, a voltage follower 520, a differentiator 530, an integrator 540, and a comparator 550.

As illustrated in FIG. 6, the charge sensitive amplifier 510 includes an operational amplifier 511, a feedback capacitor $C_f$, and a feedback MOS transistor MP2.

The operational amplifier 511 has a negative terminal to which an input voltage VIN is connected and a positive terminal to which a common voltage VCOM is connected. The feedback capacitor $C_f$ and the feedback MOS transistor MP2 are connected in parallel between the negative terminal and an output terminal of the operational amplifier 511. At this time, a bias direct current IBIASP_CSA, instead of a bias DC voltage, is applied to the feedback MOS transistor MP2.

Referring to FIG. 7, in a circuit for generating a bias direct current, a constant current IADAPTIVE_CSA of 125 nA is implemented to the bias direct current IBIASP_CSA by adjusting a current mirror ratio of a first NMOS transistor MN1 and a second NMOS transistor MN2 to 25:1, and at this time, a current flowing through a third PMOS transistor MP3 corresponds to 5 nA.

Meanwhile, during the period in which no signal charge is applied to the feedback MOS transistor MP2 of FIG. 6, the input voltage VIN follows the common voltage VCOM, which is the input of the positive terminal of the operational amplifier 511, by a negative feedback operation of the operational amplifier 511.

Meanwhile, the third PMOS transistor MP3 of FIG. 7 and the feedback MOS transistor MP2 of FIG. 6 do not correspond to a current mirror structure, but operate like a current mirror when the input voltage VIN is applied to the negative terminal of the operational amplifier 511.

When the input voltage VIN is applied to the negative terminal of the operational amplifier 511, a signal voltage ΔVs of a charge sensitive amplifier output signal CSA_OUT, which is the output of the charge sensitive amplifier 510, is developed and then operates in the form of a current mirror by the feedback MOS transistor MP2 and the third PMOS transistor MP3. Then, the voltage of the charge sensitive amplifier output signal CSA_OUT is charged to the level of the common voltage VCOM, and the charged current flows insensitive to PVT variations by a bandgap reference (BGR) circuit.

The feedback MOS transistor MP2 and the third PMOS transistor MP3 have the same width W, but since the feedback MOS transistor MP2 is designed to be 5 times longer than the third PMOS transistor MP3, the charged current of about 1 nA, which is ⅕ of 5 nA, flows.

As described above, in the charge sensitive amplifier 510 in accordance with the present disclosure, in which the bias direct current IBIASP_CSA, instead of the bias DC voltage VBIASP_CSA, is applied to a gate of the feedback MOS transistor MP2, when signal charge is injected to the input terminal of the charge sensitive amplifier 510 by radiation, the source-drain current variation of the feedback MOS transistor MP2 is small according to the PVT variations. Therefore, there are advantages in that a variation in the signal voltage ΔVs of the charge sensitive amplifier 510 is small according to the PVT variations and after charge integration, and it takes a short time to charge the integrated charge to the common voltage VCOM, which makes high-speed sensing possible.

TABLE 3

| VDD | TEMP | SS Model | SF Model | TT Model | FS Model | FF Model |
|---|---|---|---|---|---|---|
| 4.5 V | −40° C. | 225 mV | 256 mV | 253 mV | 251 mV | 287 mV |
| | 25° C. | 215 mV | 243 mV | 241 mV | 239 mV | 274 mV |
| | 85° C. | 205 mV | 277 mV | 235 mV | 215 mV | 281 mV |
| 5 V | −40° C. | 230 mV | 262 mV | 258 mV | 255 mV | 292 mV |
| | 25° C. | 220 mV | 251 mV | 248 mV | 246 mV | 280 mV |
| | 85° C. | 211 mV | 289 mV | 241 mV | 222 mV | 291 mV |
| 5.5 V | −40° C. | 233 mV | 264 mV | 261 mV | 260 mV | 295 mV |
| | 25° C. | 225 mV | 252 mV | 251 mV | 250 mV | 283 mV |
| | 85° C. | 215 mV | 293 mV | 245 mV | 228 mV | 303 mV |

TABLE 4

| VDD | TEMP | SS Model | SF Model | TT Model | FS Model | FF Model |
|---|---|---|---|---|---|---|
| 4.5 V | −40° C. | 1.247 μs | 0.885 μs | 0.876 μs | 0.863 μs | 0.637 μs |
| | 25° C. | 1.144 μs | 0.828 μs | 0.812 μs | 0.801 μs | 0.605 μs |
| | 85° C. | 1.077 μs | 1.144 μs | 0.805 μs | 0.692 μs | 0.660 μs |
| 5 V | −40° C. | 1.233 μs | 0.878 μs | 0.861 μs | 0.851 μs | 0.629 μs |
| | 25° C. | 1.125 μs | 0.824 μs | 0.806 μs | 0.788 μs | 0.592 μs |
| | 85° C. | 1.065 μs | 1.180 μs | 0.794 μs | 0.678 μs | 0.657 μs |
| 5.5 V | −40° C. | 1.217 μs | 0.864 μs | 0.853 μs | 0.847 μs | 0.619 μs |
| | 25° C. | 1.125 μs | 0.807 μs | 0.787 μs | 0.779 μs | 0.579 μs |
| | 85° C. | 1.044 μs | 1.183 μs | 0.778 μs | 0.672 μs | 0.668 μs |

Table 3 above shows the signal voltage simulation result for the PVT variations of the charge sensitive amplifier 510. Furthermore, Table 4 above shows the simulation result for the pulse width of the comparator output for the PVT variations of the radiation sensor including the charge sensitive amplifier 510 in accordance with the present disclosure to which the bias direct current IBIASP_CSA is applied.

As shown in Table 3 and Table 4 above which are the simulation results for each corner, in the radiation sensor in accordance with the present disclosure that includes the charge sensitive amplifier 510 to which the bias direct current IBIASP_CSA of FIG. 6 is applied and is designed in the 0.18 μm CMOS process, a minimum signal voltage and a maximum signal voltage of the charge sensitive amplifier output signal CSA_OUT are 205 mV and 303 mV, respectively, and minimum and maximum widths of a pulse generated by comparing the output signal having passed through the voltage follower 520, and the differentiator 530 and the integrator 540 serving as a pulse shaper with a threshold voltage VTHR_PS of the comparator are 0.579 μs and 1.247 μs, respectively.

From this, it can be confirmed that a pulse width variation of the comparator output of the radiation sensor employing the charge sensitive amplifier 510 in accordance with the present disclosure to which the bias direct current IBIASP_CSA is applied is smaller than the beta ray detection sensor using the existing charge sensitive amplifier 110 that applies the bias direct voltage VBIASP_CSA.

FIGS. 8A to 8D are graph illustrating a simulation result for the signal voltage of the radiation sensor including the charge sensitive amplifier in accordance with the present disclosure.

That is, FIGS. 8A to 8D illustrate simulation results for the output of each circuit constituting the radiation sensor in accordance with the present disclosure while changing the model parameters SS, SF, TT, FS, and FF, the power supply voltages VDD (=4.5 V, 5 V, and 5.5 V), and the temperature (−40° C., 25° C., and 85° C.) of the MOS transistor.

Figure 8A:
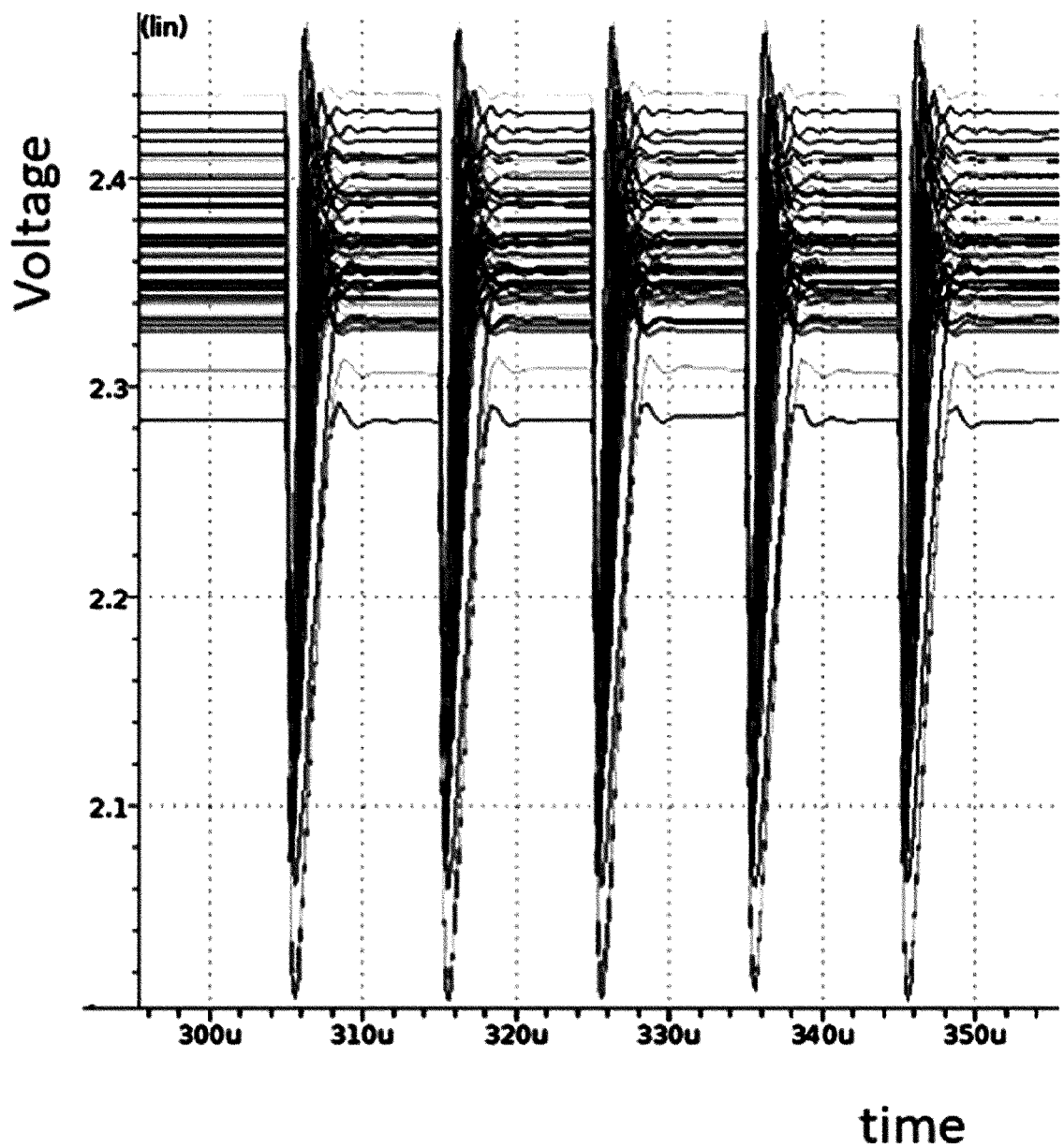
FIGS. 8A to 8D are graph illustrating a simulation result for a signal voltage of the radiation sensor including the charge sensitive amplifier in accordance with the present disclosure.
Figure 8B:
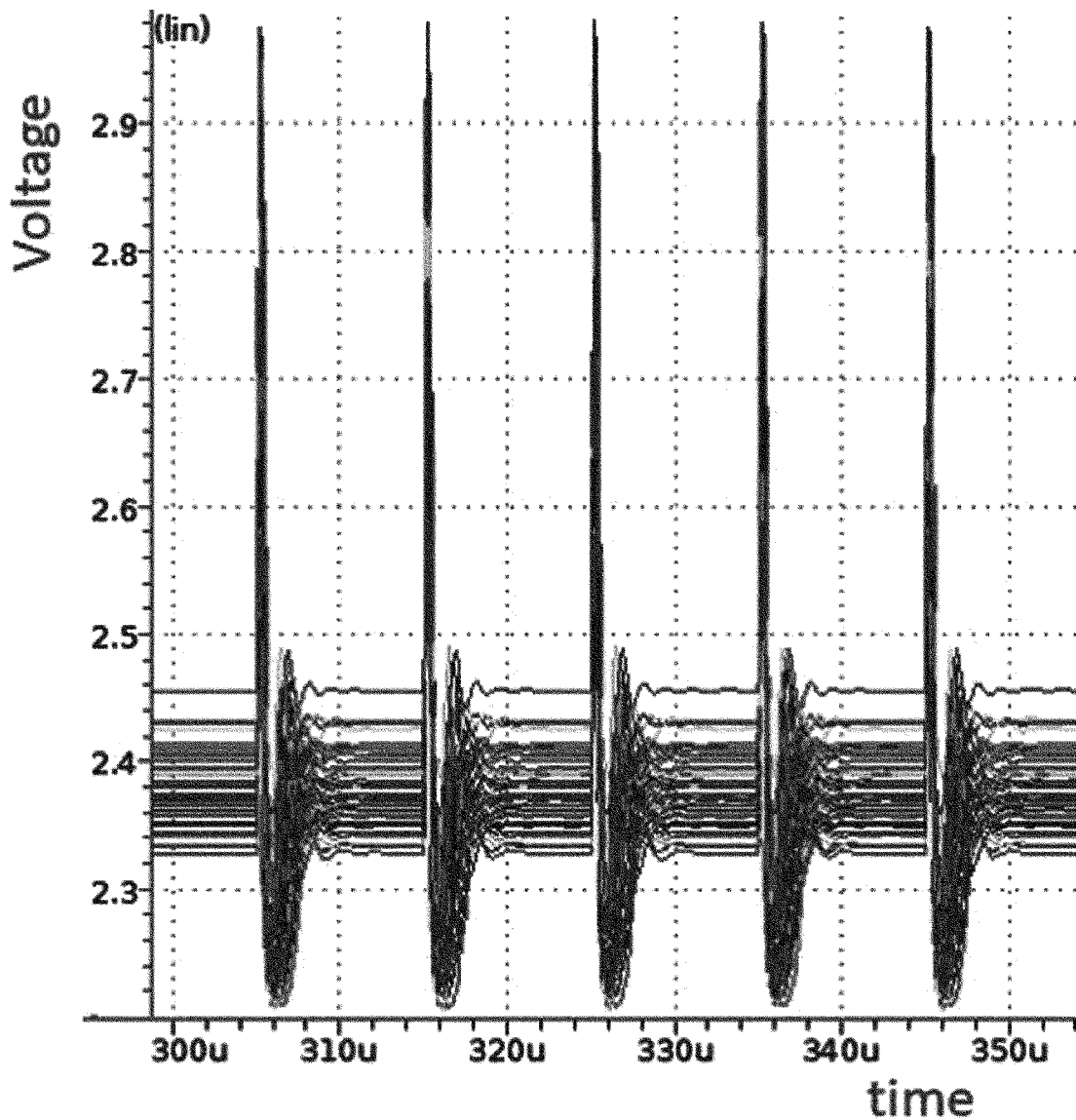
Figure 8C:
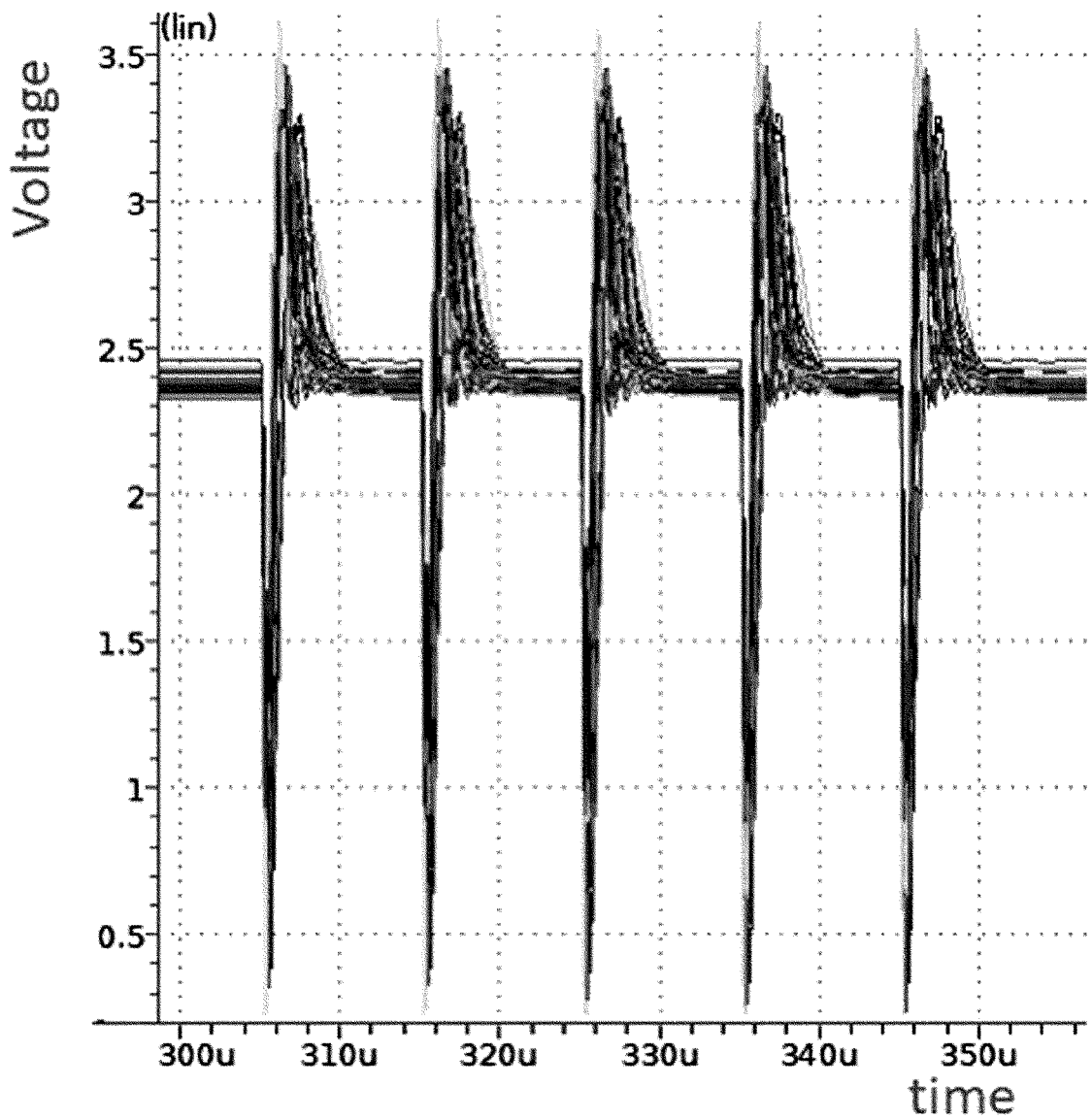
Figure 8D:
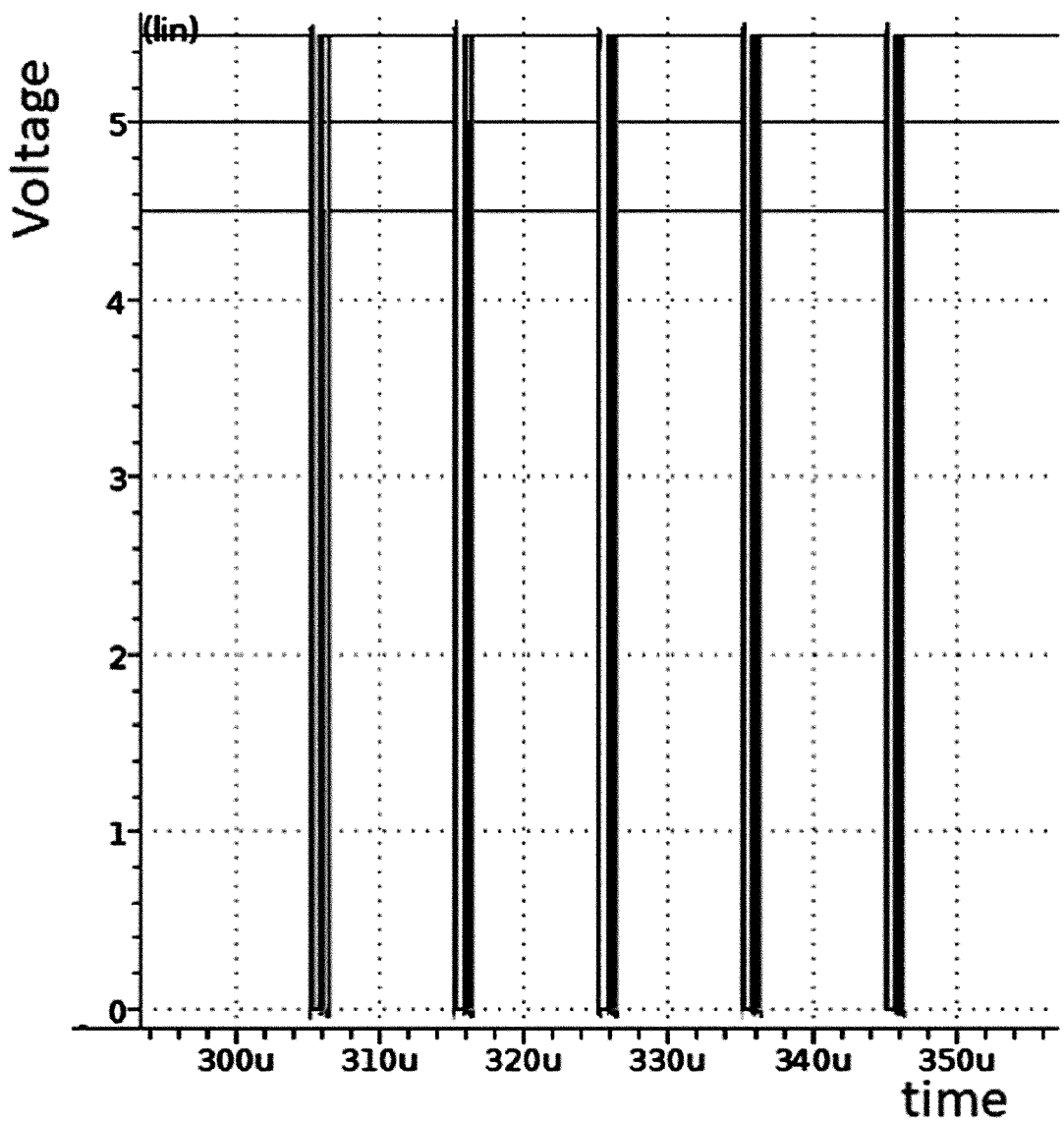

FIG. 8A illustrates the simulation result for the charge sensitive amplifier output signal CSA_OUT, FIG. 8B illustrates the simulation result for a differentiator output signal DIFF_OUT, FIG. 8C illustrates the simulation result for an integrator output signal INT_OUT, and FIG. 8D illustrates the simulation result for a comparator output signal COMP_OUT.

The pulse shaper using the differentiator 530 and the integrator 540 serves as a band pass filter (BPF) that filters low and high frequency noise. The comparator 550 compares the voltage of the integrator output signal INT_OUT having passed through the differentiator 530 and the integrator 540 with the threshold voltage VTHR_PS, and outputs the comparator output signal COMP_OUT.

The simulation result for the comparator output signal COMP_OUT is as illustrated in FIG. 8D, and the pulse width of the comparator output signal COMP_OUT is as illustrated in Table 4 above. Meanwhile, it can be seen that the minimum and maximum widths of the pulse of the comparator output signal COMP_OUT are 0.579 μs and 1.247 μs, respectively, and thus the width variation is small compared to the case of using the existing CSA circuit that applies a bias DC voltage.

Although a preferred embodiment of the present disclosure has been described in detail, the scope of the present disclosure is not limited thereto, and may be embodied in more various embodiments based on the basic concept of the present disclosure defined in the following claims, and such embodiments also fall within the scope of the present disclosure.

What is claimed is:

1. A charge sensitive amplifier comprising:
an operational amplifier having a first input terminal to which an input voltage VIN is connected, a second input terminal to which a common voltage VCOM is connected, and an output terminal through which a charge sensitive amplifier output signal CSA_OUT is outputted;
a feedback capacitor connected between the first input terminal and the output terminal; and
a feedback MOS transistor connected in parallel to the feedback capacitor between the first input terminal and the output terminal,
wherein a bias direct current generated by a current bias circuit is applied to a gate of the feedback MOS transistor.

2. The charge sensitive amplifier of claim 1, wherein the current bias circuit comprises:
a constant current source having a first terminal connected to a power supply voltage VDD;
a first NMOS transistor having a first terminal connected to a second terminal of the constant current source, a second terminal being grounded, and a gate terminal connected in common to the first terminal;
a second NMOS transistor having a gate terminal connected to a gate terminal of the first NMOS transistor and a first terminal being grounded; and
a third PMOS transistor having a first terminal connected to the common voltage VCOM, a second terminal connected to a second terminal of the second NMOS transistor, and a gate terminal connected in common to the second terminal.

3. The charge sensitive amplifier of claim 2, wherein the bias direct current flows through the second terminal and the gate terminal of the third PMOS transistor.

4. A radiation sensor comprising the charge sensitive amplifier of claim 3.

5. The radiation sensor of claim 4, further comprising:
a voltage follower configured to buffer the charge sensitive amplifier output signal CSA_OUT and output a voltage follower output signal VF_OUT;
a differentiator configured to receive the voltage follower output signal VF_OUT and the common voltage VCOM and output a differentiator output signal DIFF_OUT;
an integrator configured to receive the differentiator output signal DIFF_OUT and the common voltage VCOM and output an integrator output signal INT_OUT; and
a comparator configured to compare the integrator output signal INT_OUT and a threshold voltage VTHR_PS and process the compared signal.

6. The radiation sensor of claim 5, wherein the radiation sensor is a beta-ray sensor using a nickel isotope (Ni-63).

7. The charge sensitive amplifier of claim 2, wherein the third PMOS transistor and the feedback MOS transistor operate in a form of a current mirror.

8. A radiation sensor comprising the charge sensitive amplifier of claim 7.

9. The radiation sensor of claim 8, further comprising:
a voltage follower configured to buffer the charge sensitive amplifier output signal CSA_OUT and output a voltage follower output signal VF_OUT;
a differentiator configured to receive the voltage follower output signal VF_OUT and the common voltage VCOM and output a differentiator output signal DIFF_OUT;
an integrator configured to receive the differentiator output signal DIFF_OUT and the common voltage VCOM and output an integrator output signal INT_OUT; and
a comparator configured to compare the integrator output signal INT_OUT and a threshold voltage VTHR_PS and process the compared signal.

10. The radiation sensor of claim 9, wherein the radiation sensor is a beta-ray sensor using a nickel isotope (Ni-63).

11. A radiation sensor comprising the charge sensitive amplifier of claim 2.

12. The radiation sensor of claim 11, further comprising:
a voltage follower configured to buffer the charge sensitive amplifier output signal CSA_OUT and output a voltage follower output signal VF_OUT;
a differentiator configured to receive the voltage follower output signal VF_OUT and the common voltage VCOM and output a differentiator output signal DIFF_OUT;
an integrator configured to receive the differentiator output signal DIFF_OUT and the common voltage VCOM and output an integrator output signal INT_OUT; and
a comparator configured to compare the integrator output signal INT_OUT and a threshold voltage VTHR_PS and process the compared signal.

13. The radiation sensor of claim 12, wherein the radiation sensor is a beta-ray sensor using a nickel isotope (Ni-63).

14. A radiation sensor comprising the charge sensitive amplifier of claim 1.

15. The radiation sensor of claim 14, further comprising:
a voltage follower configured to buffer the charge sensitive amplifier output signal CSA_OUT and output a voltage follower output signal VF_OUT;
a differentiator configured to receive the voltage follower output signal VF_OUT and the common voltage VCOM and output a differentiator output signal DIFF_OUT;
an integrator configured to receive the differentiator output signal DIFF_OUT and the common voltage VCOM and output an integrator output signal INT_OUT; and
a comparator configured to compare the integrator output signal INT_OUT and a threshold voltage VTHR_PS and process the compared signal.

16. The radiation sensor of claim 15, wherein the radiation sensor is a beta-ray sensor using a nickel isotope (Ni-63).

* * * * *